United States Patent
Osano et al.

(10) Patent No.: US 7,786,548 B2
(45) Date of Patent: Aug. 31, 2010

(54) ELECTRIC ELEMENT, MEMORY DEVICE, AND SEMICONDUCTOR INTEGRATED CIRCUIT

(75) Inventors: Koichi Osano, Osaka (JP); Shunsaku Muraoka, Osaka (JP); Satoru Mitani, Osaka (JP); Kumio Nago, Nara (JP)

(73) Assignee: Panasonic Corporation, Osaka (JP)

( * ) Notice: Subject to any disclaimer, the term of this patent is extended or adjusted under 35 U.S.C. 154(b) by 513 days.

(21) Appl. No.: 11/883,481

(22) PCT Filed: Oct. 26, 2006

(86) PCT No.: PCT/JP2006/021387

§ 371 (c)(1),
(2), (4) Date: Aug. 1, 2007

(87) PCT Pub. No.: WO2007/072628

PCT Pub. Date: Jun. 28, 2007

(65) Prior Publication Data

US 2008/0111245 A1     May 15, 2008

(30) Foreign Application Priority Data

Dec. 22, 2005  (JP)  ............................. 2005-369090

(51) Int. Cl.
*H01L 27/08* (2006.01)
(52) U.S. Cl. .............................. 257/528; 257/E27.071; 257/536; 257/767; 438/396
(58) Field of Classification Search .......... 257/E27.071, 257/E27.004, E27.081, E21.645, E45.003, 257/767, 536, 528, 533, 537; 438/396, 329, 438/330, 382, 171, 190, 210, 230, 238
See application file for complete search history.

(56) References Cited

U.S. PATENT DOCUMENTS

| | | | | |
|---|---|---|---|---|
| 5,623,439 A * | 4/1997 | Gotoh et al. | ................. | 365/145 |
| 5,668,040 A * | 9/1997 | Byun | ......................... | 438/396 |
| 5,741,721 A * | 4/1998 | Stevens | ...................... | 438/396 |
| 5,949,071 A * | 9/1999 | Ruffner et al. | ........... | 250/338.3 |
| 6,204,139 B1 | 3/2001 | Liu et al. | | |
| 6,335,551 B2 * | 1/2002 | Takemura | .................... | 257/306 |
| 6,815,744 B1 * | 11/2004 | Beck et al. | ................... | 257/295 |
| 6,822,277 B2 * | 11/2004 | Nakamura et al. | .......... | 257/295 |
| 6,888,773 B2 | 5/2005 | Morimoto | | |
| 6,992,022 B2 * | 1/2006 | Shimamoto et al. | ......... | 438/780 |
| 7,025,647 B2 * | 4/2006 | Miyazawa | .................... | 445/24 |
| 7,352,022 B2 * | 4/2008 | Lee et al. | .................... | 257/296 |
| 7,446,391 B2 * | 11/2008 | Odagawa et al. | ............ | 257/536 |
| 7,566,971 B2 * | 7/2009 | Matsuzaki | .................. | 257/750 |

(Continued)

FOREIGN PATENT DOCUMENTS

JP   2004-185754   2/2004

(Continued)

*Primary Examiner*—Chris Chu
(74) *Attorney, Agent, or Firm*—McDermott Will & Emery LLP

(57) ABSTRACT

An electric element includes a first electrode (1), a second electrode (3), and a variable-resistance film (2) connected between the first electrode (1) and the second electrode (3). The variable-resistance film (2) contains Fe (iron) and O (oxygen) as constituent elements. The content of oxygen in the variable-resistance film (2) is modulated along the film thickness direction.

17 Claims, 13 Drawing Sheets

U.S. PATENT DOCUMENTS

| | | |
|---|---|---|
| 2004/0114438 A1 | 6/2004 | Morimoto |
| 2006/0097288 A1 | 5/2006 | Baek et al. |
| 2006/0120205 A1 | 6/2006 | Odagawa et al. |

FOREIGN PATENT DOCUMENTS

| | | |
|---|---|---|
| JP | 2004-342843 | 2/2004 |
| JP | 2006-140464 | 1/2006 |
| WO | WO 2006/028117 A1 | 3/2006 |
| WO | WO 2006/109622 A1 | 10/2006 |

\* cited by examiner

Half width of resistance distribution (relative value)

Thickness of periodic unit layer (nm)

FIG.12
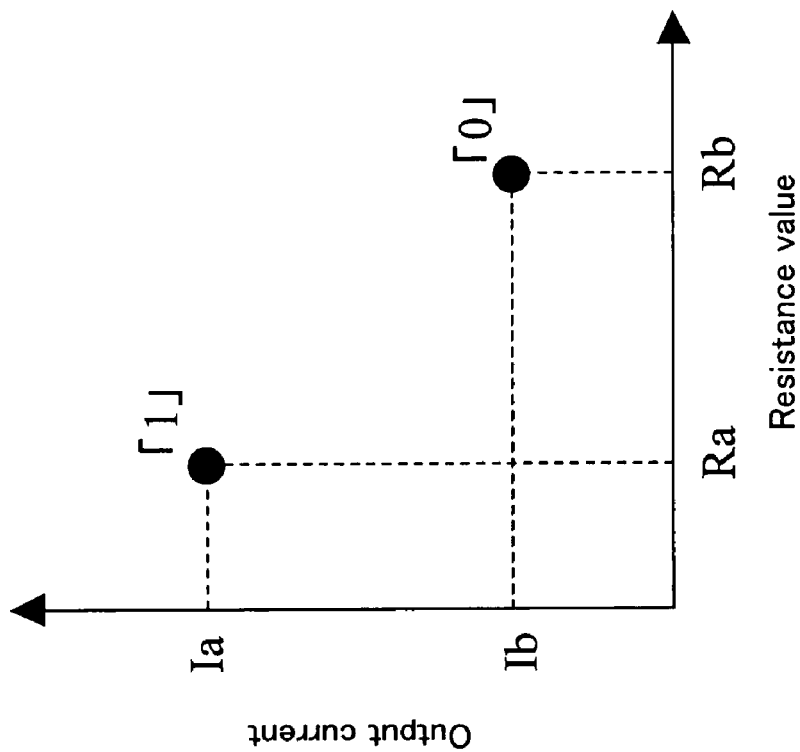
Relationship between output current and resistance value
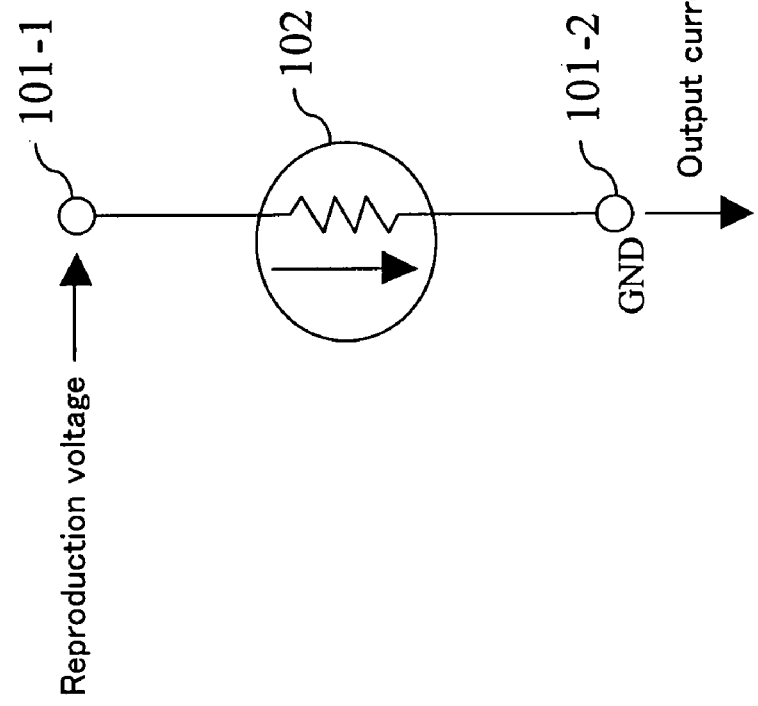
Reproduction

ELECTRIC ELEMENT, MEMORY DEVICE, AND SEMICONDUCTOR INTEGRATED CIRCUIT

RELATED APPLICATIONS

This application is the U.S. National Phase under 35 U.S.C. §371 of International Application No. PCT/JP2006/321387, filed on Oct. 26, 2006, which in turn claims the benefit of Japanese Application No. 2005-369090, filed on Dec. 22, 2005, the disclosures of which Applications are incorporated by reference herein.

TECHNICAL FIELD

The present invention relates to an electric element, memory device, and semiconductor integrated circuit formed using a state-variable material whose resistance value varies according to an applied electric pulse.

BACKGROUND ART

In recent years, along with the advancement of the digital techniques in electronic devices, demands for nonvolatile memory devices have been increasing for storage of data, such as a picture, and the like. Further, demands for increasing the capacity of a memory device, reducing the write power, shortening the read and write times, and prolonging the device's life have been escalating. To meet such demands, U.S. Pat. No. 6,204,139 (Patent Document 1) discloses a technique for forming a nonvolatile memory device using a perovskite material whose resistance value varies according to an applied electric pulse (e.g., $Pr_{1-x}Ca_xMnO(PCMO)$, $LaSrMnO_3(LSMO)$, $GdBaCo_xO_y(GBCO)$, etc.). According to the technique disclosed in this publication, a predetermined electric pulse is applied to these materials (hereinafter, generically referred to as "variable-resistance material(s)") to increase or decrease the resistance value of the materials. The resistance value which has varied as a result of application of the pulse is used for memorization of different values. Based on this scheme, the materials are used for memory devices.

Japanese Laid-Open Patent Publication No. 2004-342843 (Patent Document 2) discloses a technique relating to a nonvolatile memory device wherein a voltage is applied to an electrode formed of Ag or Cu on an amorphous oxide (e.g., an oxide formed by one or more elements selected from Ti, V, Fe, Co, Y, Zr, Nb, Mo, Hf, Ta, W, Ge, and Si) such that Ag or Cu, which is the material of the electrode, is ionized and diffused in a thin film, whereby the resistance value of the amorphous oxide is changed.

[Patent Document 1] U.S. Pat. No. 6,204,139
[Patent Document 2] Japanese Laid-Open Patent Publication No. 2004-342843

DISCLOSURE OF INVENTION

Problems to be Solved by the Invention

However, as for a nonvolatile memory device fabricated using an oxide of a perovskite structure, such as a high-temperature superconductor material, CMR material, or the like, as the material for a variable-resistance film, there is a possibility that a plurality of such memory devices fabricated under the same fabrication conditions have different variable-resistance characteristics. For example, even when equal electric pulses are applied to the memory devices fabricated under the same conditions, the memory devices can have different resistance values (exhibit different variable-resistance characteristics) in some cases. Namely, in some cases, reproducibility of the memory devices (repetitive producibility of devices having identical characteristics) is low, resulting in low production yield.

A nonvolatile memory device described in Patent Document 2 (nonvolatile memory device formed of an amorphous oxide material with Ag or Cu electrodes) has a variable-resistance film material layer formed by an amorphous film and therefore can experience a variation in characteristics during hours of continuous use due to possible crystallization of the amorphous film.

An objective of the present invention is to provide an electric element with higher reproducibility and improved production yield.

Means for Solving the Problems

According to one aspect of the present invention, an electric element includes a first electrode, a second electrode, and a variable-resistance film. The variable-resistance film is connected between the first electrode and the second electrode. The variable-resistance film contains Fe (iron) and O (oxygen) as constituent elements, and the content of oxygen is modulated along a film thickness direction.

In the electric element including the variable-resistance film which contains Fe (iron) and O (oxygen) as constituent elements, we found that, fluctuations in variable-resistance characteristic of the electric element can be suppressed, as compared with conventional electric elements, by modulating the content of oxygen in the variable-resistance film along the film thickness direction. Thus, reproducibility and production yield of the electric element can be improved as compared with conventional electric elements. Meanwhile, the material of the variable-resistance film is not amorphous but has a microcrystalline structure. Therefore, a variation in characteristics is unlikely to occur even after hours of use as compared with conventional electric elements.

Preferably, the variable-resistance film includes a plurality of reference layers deposited in succession along the film thickness direction. The oxygen content in each of the plurality of reference layers is different from those of neighboring reference layers.

Preferably, the variable-resistance film includes a plurality of periodic unit layers deposited in succession along the film thickness direction. Each of the plurality of periodic unit layers includes a plurality of reference layers deposited in succession along the film thickness direction. The oxygen content in each of the plurality of reference layers is different from those of neighboring reference layers.

Preferably, the plurality of reference layers include a first reference layer and a second reference layer. The first reference layer has a first oxygen content. The second reference layer has a second oxygen content and is deposited on the first reference layer.

Preferably, the oxygen content in each of the plurality of reference layers is different from those of the other reference layers included in the same periodic unit layer.

Preferably, the variable-resistance film includes a plurality of periodic unit layers deposited in succession along the film thickness direction. Each of the plurality of periodic unit layers has an oxygen content gradually changing along the film thickness direction.

Preferably, the thickness of the periodic unit layer is 50 nm or less.

Preferably, the thickness of the variable-resistance film is 200 nm or less.

Preferably, at least one of the first electrode and the second electrode is formed using any of Ag, Au, Pt, Ru, RuO$_2$, Ir, and IrO$_2$.

Preferably, the electric element stores 1-bit or multi-bit information by applying a predetermined electric pulse between the first electrode and the second electrode such that the resistance value is changed.

Preferably, 1-bit or multi-bit information is read from the electric element by applying a predetermined voltage between the first electrode and the second electrode such that an electric current flows according to the resistance value of the electric element.

According to another aspect of the present invention, a memory device includes: a plurality of word lines; a plurality of bit lines; a plurality of plate lines corresponding to the plurality of bit lines on a one-to-one basis; a plurality of transistors; a plurality of electric elements corresponding to the plurality of transistors on a one-to-one basis; a word line driver for driving the plurality of word lines; and a bit line/plate line driver for driving the plurality of bit lines and the plurality of plate lines. Each of the plurality of transistors and an electric element corresponding to the transistor are connected in series between any one of the plurality of bit lines and a plate line corresponding to the bit line. Each of the plurality of transistors is connected between a bit line corresponding to the transistor and an electric element corresponding to the transistor, a gate of the transistor being connected to any one of the plurality of word lines. Each of the plurality of electric elements includes a first electrode, a second electrode and a variable-resistance film. The first electrode is connected to a transistor corresponding to the electric element. The second electrode is connected to a plate line corresponding to the electric element. The variable-resistance film is connected between the first electrode and the second electrode. The variable-resistance film contains Fe (iron) and O (oxygen) as constituent elements, and the content of oxygen is modulated along the film thickness direction.

In the above-described memory device, a memory array which occupies a large part of the memory device can be fabricated with high accuracy. Therefore, the memory device can be fabricated with a considerably high production yield as compared with conventional memory devices. The material of the variable-resistance film of the memory is not amorphous but has a microcrystalline structure. Therefore, the reliability of the electric element as the memory array can be maintained even after hours of use as compared with conventional memory devices.

Preferably, in order to store information in any one of the plurality of electric elements, the word line driver applies an activation voltage to one of the plurality of word lines connected to the electric element in which the information is to be stored. The bit line/plate line driver applies a first electric pulse to one of the plurality of bit lines connected to the electric element in which the information is to be stored and applies a second electric pulse to a plate line corresponding to the bit line.

In the above-described memory device, a predetermined electric pulse is applied only to the electric element in which the information is to be stored, so that information can be written in the electric element.

Preferably, in order to reproduce information stored in any one of the plurality of electric elements, the word line driver applies an activation voltage to one of the plurality of word lines connected to the electric element from which the information is to be read. The bit line/plate line driver applies a first reproduction voltage to one of the plurality of bit lines connected to the electric element from which the information is to be read and applies a second reproduction voltage to a plate line corresponding to the bit line.

In the above-described memory device, a predetermined voltage is applied only to the electric element from which the information is to be read, so that information can be read from the electric element.

According to still another aspect of the present invention, a semiconductor integrated circuit includes the above-described memory device and a logic circuit for performing a predetermined operation. The logic circuit has a memorization mode and a reproduction mode. In the memorization mode, the logic circuit stores bit data in the memory device. In the reproduction mode, the logic circuit reads bit data stored in the memory device.

According to still another aspect of the present invention, a semiconductor integrated circuit includes the above-described memory device and a processor which has a program execution mode and a program rewrite mode. In the program execution mode, the processor operates according to a program stored in the memory device. In the program rewrite mode, the processor rewrites a program stored in the memory device to another new program received from outside.

EFFECTS OF THE INVENTION

As described above, the reproducibility of the electric element can be improved, and the electric element can be fabricated with high production yield.

BRIEF DESCRIPTION OF DRAWINGS

FIG. 12 illustrates an output current of the electric element shown in FIG. 10.

DESCRIPTION OF REFERENCE NUMERALS

Figure 1:
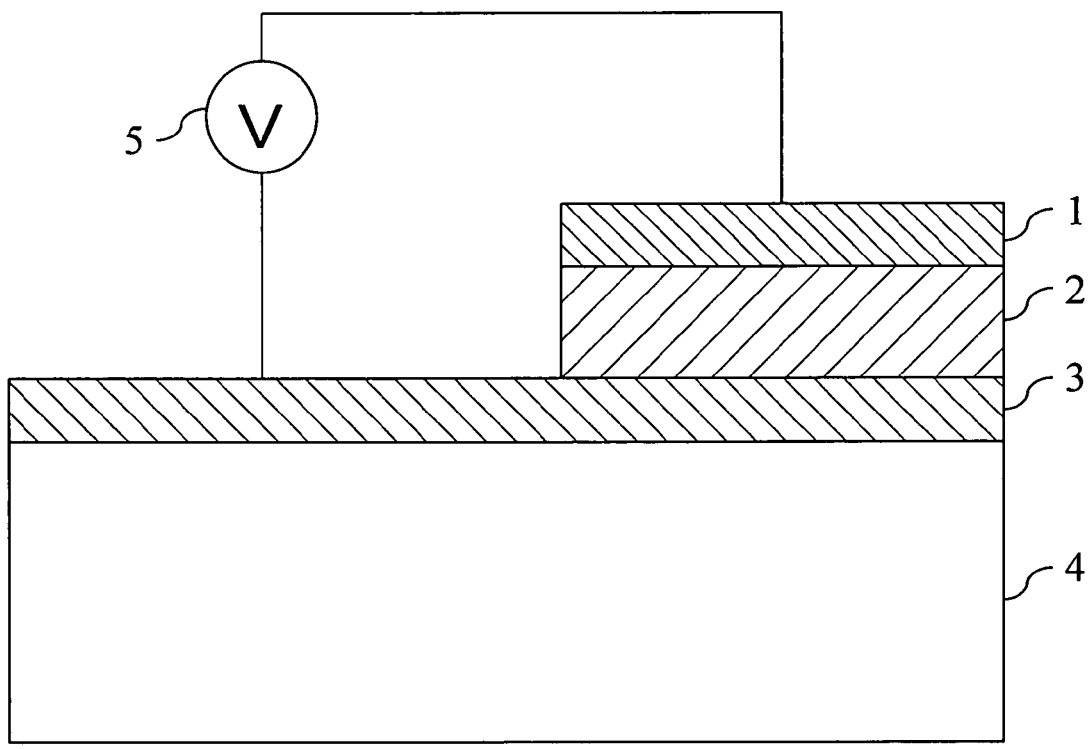
FIG. 1 shows a basic structure of an electric element.

1 Upper electrode
2 Variable resistance film
3 Lower electrode
4 Substrate
5 Power supply
101-1, 101-2 Terminal
102 Electric element
200 Memory device
201 Memory array
202 Address buffer
203 Control section
204 Row decoder
205 Word line driver
206 Column decoder
207 Bit line/plate line driver
MC211, MC212, MC221, MC222 Memory cell
W1, W2 Word line
B1, B2 Bit line
P1, P2 Plate line
300 Semiconductor integrated circuit
301 Logic circuit
400 Semiconductor integrated circuit
401 Processor
402 Interface

BEST MODE FOR CARRYING OUT THE INVENTION

Hereinafter, embodiments of the present invention are described in detail with reference to the drawings. In this specification, like reference numerals are denoted by like elements, and descriptions thereof are not repeated.

(Basic Structure and Basic Characteristics of Electric Element)

The basic structure and basic characteristics of an electric element used in the embodiments of the present invention are described.

FIG. 1 shows a basic structure of the electric element. The electric element includes a substrate 4, a lower electrode 3 formed on the substrate 4, a variable-resistance film 2 formed on the lower electrode 3, and an upper electrode 1 formed on the variable-resistance film 2. A power supply 5 applies a predetermined voltage between the upper electrode 1 and the lower electrode 3. Application by the power supply 5 of a voltage which meets a predetermined condition increases/decreases the resistance value of the electric element. For example, application of an electric pulse having a voltage value greater than a certain threshold value decreases the resistance value of the electric element. On the other hand, application of a voltage having a voltage value smaller than the threshold value (voltage which does not meet the predetermined condition) does not affect the variation in resistance of the electric element (namely, the resistance value of the electric element does not change).

A material having a lower work function is more preferable as the material used for the upper electrode 1 and the lower electrode 3. For example, Ag, Au, Pt, Ru, $RuO_2$, Ir, and $IrO_2$ are preferable. It should be noted however that, considering that the substrate 4 is, in the common procedure, heated for the formation of the variable-resistance film 2, the material used for the lower electrode 3 is desirably stable at the temperature of this heating.

The thickness of the variable-resistance film 2 is preferably 1 μm or less. With the thickness of the variable-resistance film 2 being 1 μm or less, it is sufficiently possible to change the resistance value of the electric element by an electric pulse.

The thickness of the variable-resistance film 2 is preferably 200 nm or less. In a lithography step in the production process, the variable-resistance film 2 is processed more easily as it is thinner. Also, as the variable-resistance film 2 is thinner, the resistance value of the electric element is changed by an electric pulse of a lower voltage value.

The variable-resistance film 2 of this embodiment contains Fe (iron) and O (oxygen) as the main constituents, and the oxygen content of the variable-resistance film 2 is modulated along the film thickness direction. Hereinafter, the reasons for using such a variable-resistance film will be described through comparison between an electric element including a variable-resistance film whose oxygen content is modulated along the film thickness direction (electric element (A), electric element (A'), electric element (A")) and an electric element including a variable-resistance film whose oxygen content is uniform along the film thickness direction (electric element (B)).

<Electric Element (A)>

First, the characteristics of electric element (A) are described. Electric element (A) includes a plurality of reference layers deposited in succession along the film thickness direction to constitute the variable-resistance film 2. Herein, the "reference layer(s)" refers to a layer having a uniform oxygen content along the film thickness direction. It should be noted that each of the reference layers has an oxygen content different from those of neighboring reference layers.

Figure 2:
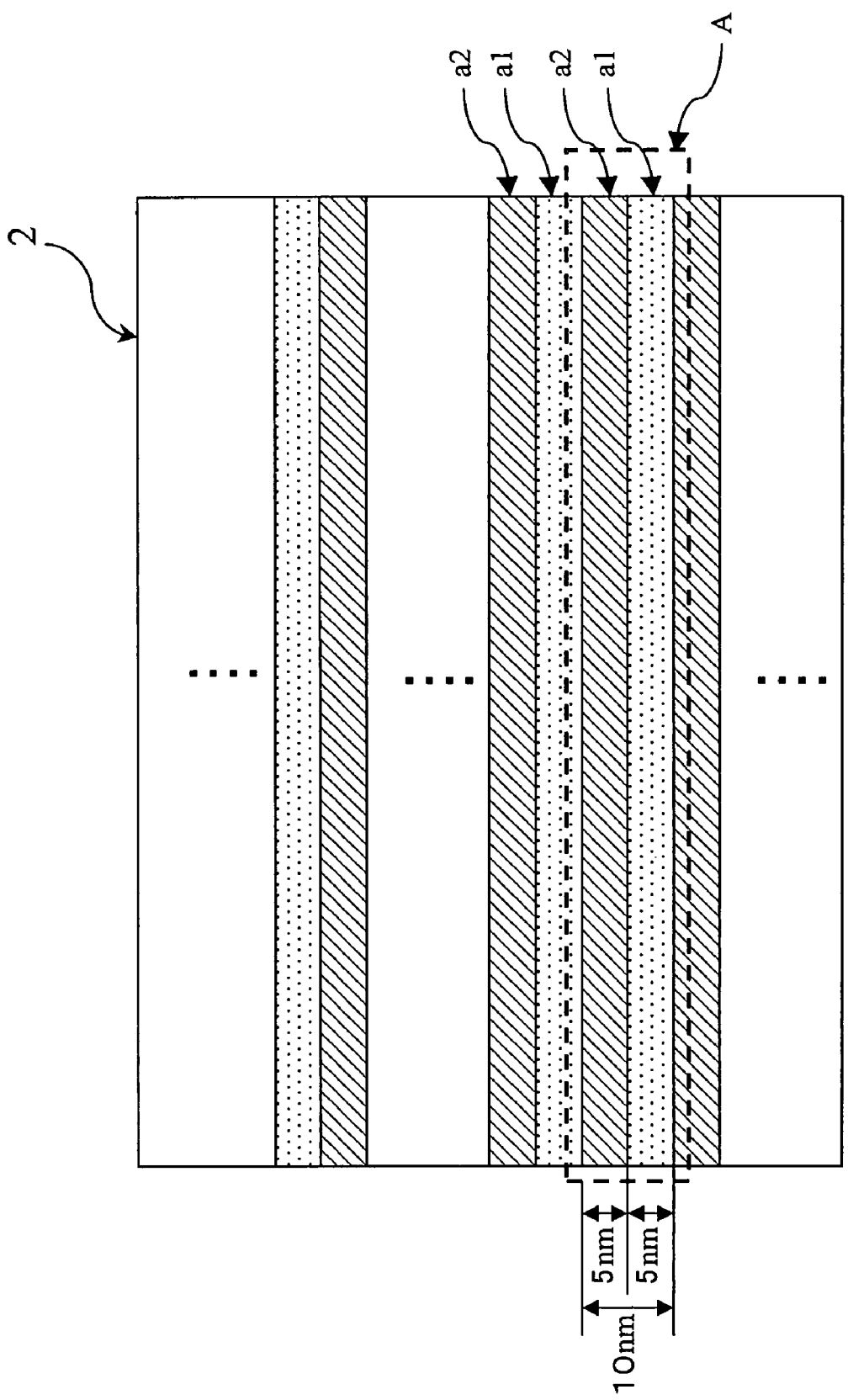
FIG. 2 shows an example of the composition of a variable-resistance film shown in FIG. 1.

As shown in FIG. 1, the lower electrode 3 was formed on the substrate 4. Then, sputtering was performed using a target of Fe—O to form the variable-resistance film 2 on the lower electrode 3. Then, the upper electrode 1 was formed on the variable-resistance film 2. In the formation of the variable-resistance film 2, oxygen was periodically mixed in Ar gas at the oxygen partial pressure of "4%" such that the cycle of composition modulation (i.e., the cycle of change in oxygen content along the film thickness direction) was "10 nm". Specifically, referring to FIG. 2, in the first period, sputtering was performed without oxygen mixed therein (i.e., under the condition of oxygen partial pressure "0%") to form a reference layer a1 of 5 nm, and in the second period, sputtering was performed with oxygen mixed therein (i.e., under the condition of oxygen partial pressure "4%") to form a reference layer a2 of 5 nm. In such a way, the condition of oxygen partial pressure was alternately (periodically) changed to form the variable-resistance film 2 including a plurality of periodic unit layers A deposited in succession along the film thickness direction. The plurality of periodic unit layers have identical structures. Herein, the periodic unit layer A consists of one reference layer a1 and one reference layer a2 as indicated by broken-line box in FIG. 2. The aforementioned "cycle of composition modulation of 10 nm" refers to the sum of the thickness of the layers constituting the periodic unit layer A being "10 nm" (the reference layer a1 "5 nm" and the reference layer a2 "5 nm"). Thus, electric element (A) was fabricated.

Upper electrode 1: Pt (thickness: 0.4 μm)
Variable-resistance film 2: Fe—O (thickness: 0.1 μm, thickness of periodic unit layer: 10 nm, two reference layers)
Lower electrode 3: Pt (thickness: 0.4 μm)

Then, two types of electric pulses (positive pulse and negative pulse) were alternately applied to the thus-fabricated electric element (A), and the resistance value of the electric element was measured at every application of the electric pulse. The positive pulse was an electric pulse which rendered the upper electrode 1 positive with respect to the lower electrode 3 and had, in this example, the voltage value of "+2.5 V" and the pulse width of "100 nsec". The negative pulse was an electric pulse which rendered the upper electrode 1 negative with respect to the lower electrode 3 and had, in this example, the voltage value of "−2.5 V" and the pulse width of "100 nsec". Herein, a measurement voltage (voltage which does not affect the variation in resistance of the electric element; herein, 0.5 V) was applied between the upper electrode 1 and the lower electrode 3 in order to measure the resistance value of the electric element. Namely, the voltage value of the measurement voltage and the current value of a current that flowed when the measurement voltage was applied were used to calculate the resistance value.

Figure 3:
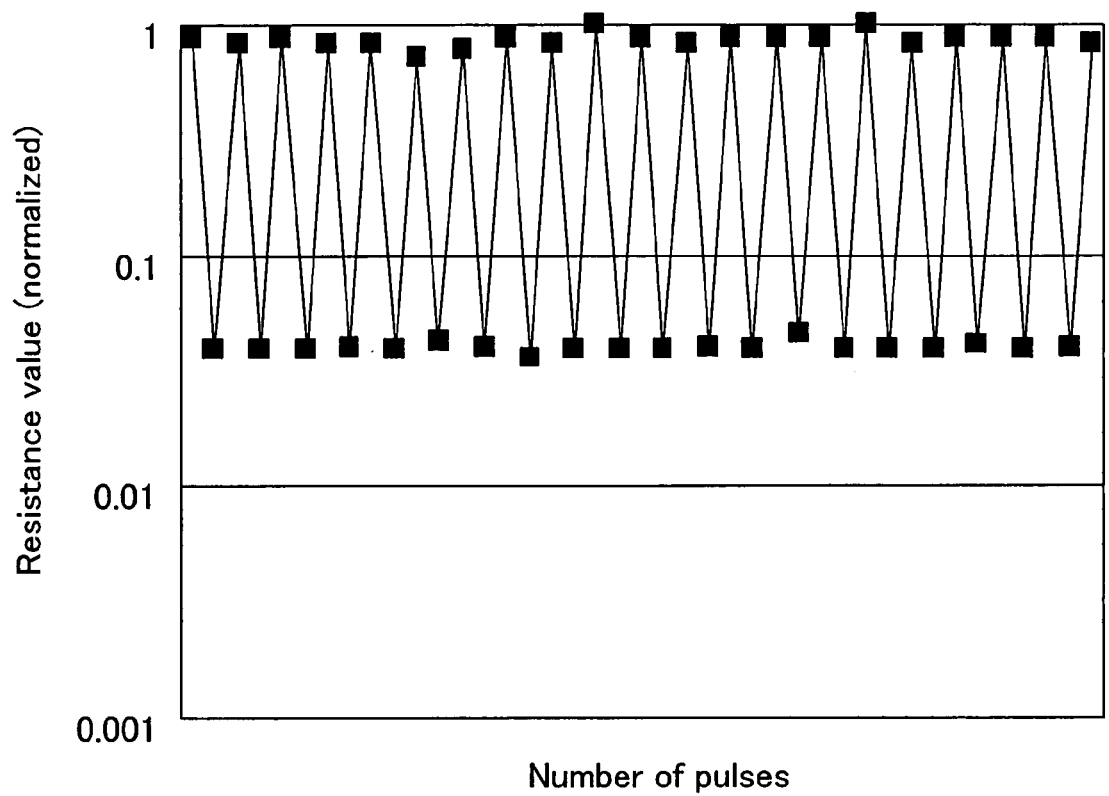
FIG. 3 is a graph showing the variation in resistance of an electric element which has the variable-resistance film shown in FIG. 2.

The measurement result of the above-described experiment is shown in FIG. 3. The resistance value of the electric element was decreased by application of the positive pulse, while the resistance value of the electric element was increased by application of the negative pulse. Herein, two types of electric pulses were alternately applied. As a result, the resistance state of the electric element was periodically changed such that the electric element was transitioned from the high resistance state (the state of higher resistance than the other) to the low resistance state (the state of lower resistance than the other) by application of the positive pulse, while the electric element was transitioned from the low resistance state to the high resistance state by application of the negative pulse. Although in general the variation in resistance is unstable in the early period of measurement, FIG. 3 shows the data generally stable as for the variation in resistance of the variable resistance which was obtained after repetitive application of the electric pulses. The resistance values of the electric element shown in FIG. 3 were obtained by normalizing respective resistance values using the maximum resistance value among the measurement results. In electric element (A), the maximum resistance value was "1.2 MΩ".

<Electric Element (B)>

Next, the characteristics of electric element (B) which was compared with electric element (A) are described.

As shown in FIG. 1, the lower electrode 3 was formed on the substrate 4. Then, sputtering was performed using a target of Fe—O to form the variable-resistance film 2 on the lower electrode 3. Then, the upper electrode 1 was formed on the variable-resistance film 2. In the formation of the variable-resistance film 2, sputtering was carried out in Ar gas at the oxygen partial pressure of "2%". Namely, the oxygen partial pressure was constant at "2%". Thus, electric element (B) was fabricated.

Upper electrode 1: Pt (thickness: 0.4 μm)
Variable-resistance film 2: Fe—O (thickness: 0.1 μm, uniform composition)
Lower electrode 3: Pt (thickness: 0.4 μm)

Then, two types of electric pulses (positive pulse and negative pulse) were alternately applied to the thus-fabricated electric element (B) as were done on electric element (A), and the resistance value of the electric element was measured at every application of the electric pulse.

The result of the above-described experiment was that, similarly to electric element (A), the resistance value of electric element (B) was decreased by application of the positive pulse, while the resistance value of electric element (B) was increased by application of the negative pulse.

<Comparison Between Electric Element (A) and Electric Element (B)>

Then, fabrication of electric element (A) was carried out 10 times under the same film formation conditions. A substrate fabricated through one film formation cycle included a plurality of electric elements (A). Then, 5 electric elements (A) were selected from each of 10 resultant substrates, and the above-described experiment was carried out on each of the selected electric elements (A) to measure the resistance value. Specifically, two types of electric pulses were alternately applied to each electric element (A) 40 times to measure 40 resistance values for each electric element (A). Such a measurement process was carried out on every one of 50 electric elements (A). As a result, 2000 measurement values (resistance values) in total were obtained.

Figure 4:
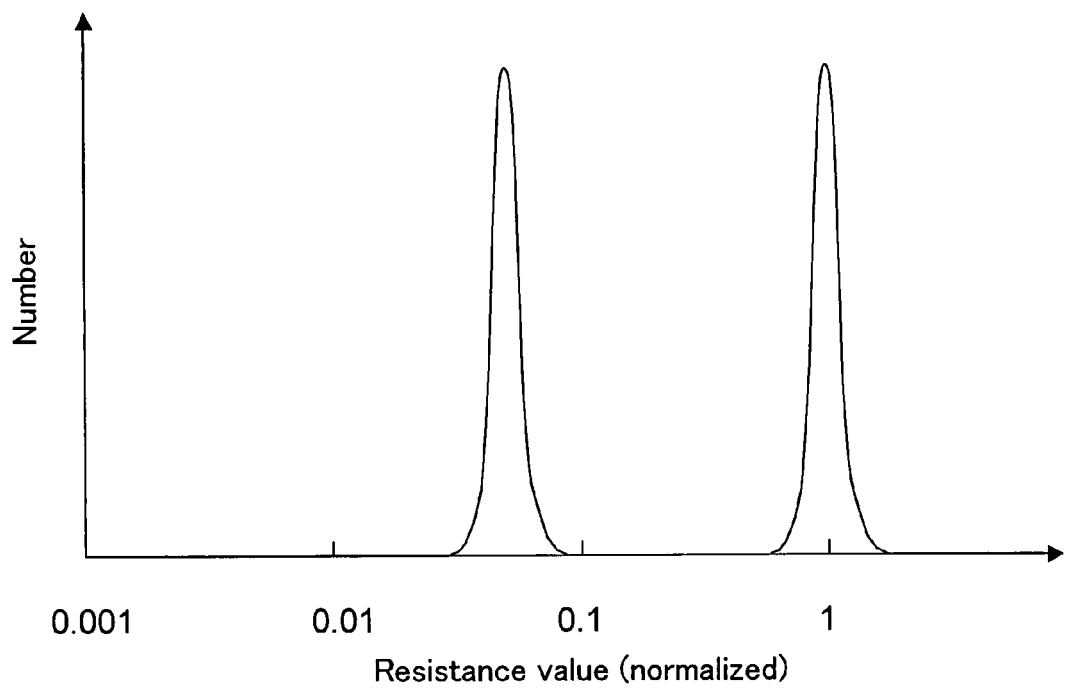
FIG. 4 is a graph showing a distribution of measured values for the electric element which has the variable-resistance film shown in FIG. 2.

FIG. 4 shows the measurement results of the plurality of electric elements (A). FIG. 4 illustrates the distribution of the measurement values. It should be noted that in FIG. 4 the measurement values (resistance values) were normalized such that the average of the resistance values concentratedly occurring on the relatively high resistance side is "1".

Figure 5:
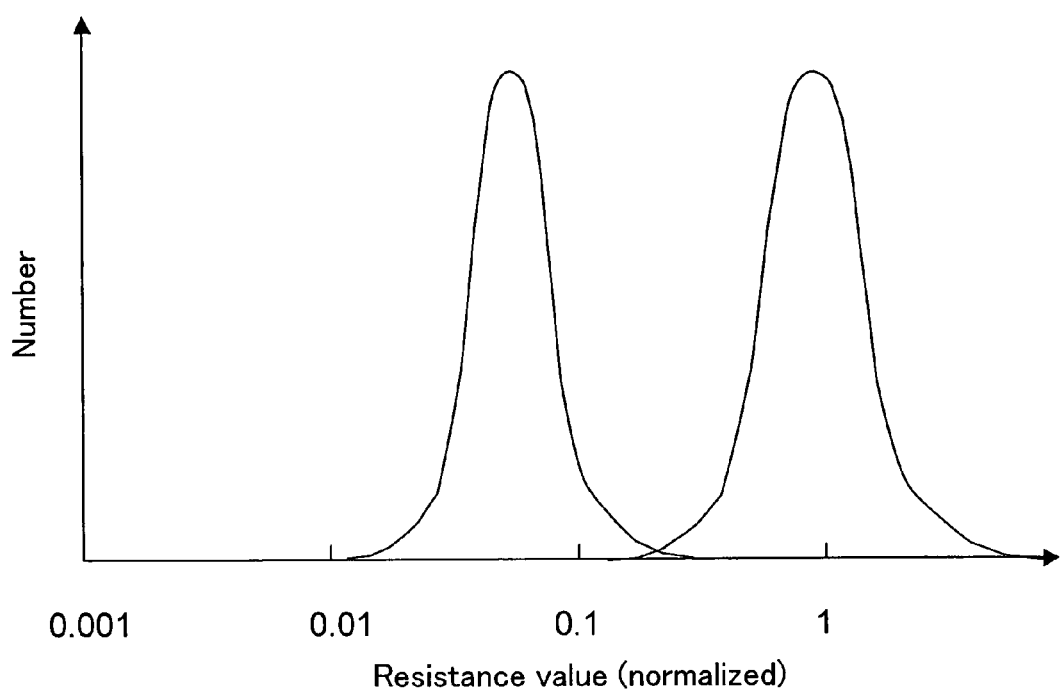
FIG. 5 is a graph showing a distribution of measured values for an electric element which has a variable-resistance film having a uniform composition.

Fabrication of electric element (B) was also carried out 10 times under the same film formation conditions as was for electric element (A). FIG. 5 shows the measurement results of the plurality of electric elements (B). It should be noted that in FIG. 5 the measurement values (resistance values) were normalized in the same manner as for FIG. 4.

Comparing FIG. 4 and FIG. 5, it was found that electric elements (A) had a smaller distribution (FIG. 4), such that the measurement values (resistance values) concentrated at specific resistance values (herein, two resistance values).

<Electric Element (A')>

Next, the characteristics of electric element (A') are described. Electric element (A') includes a plurality of periodic unit layers deposited in succession along the film thickness direction to constitute the variable-resistance film 2. Each of the periodic unit layers is formed by three reference layers deposited in succession along the film thickness direction. It should be noted that each of the three reference layers has an oxygen content different from those of the other two reference layers.

Figure 6:
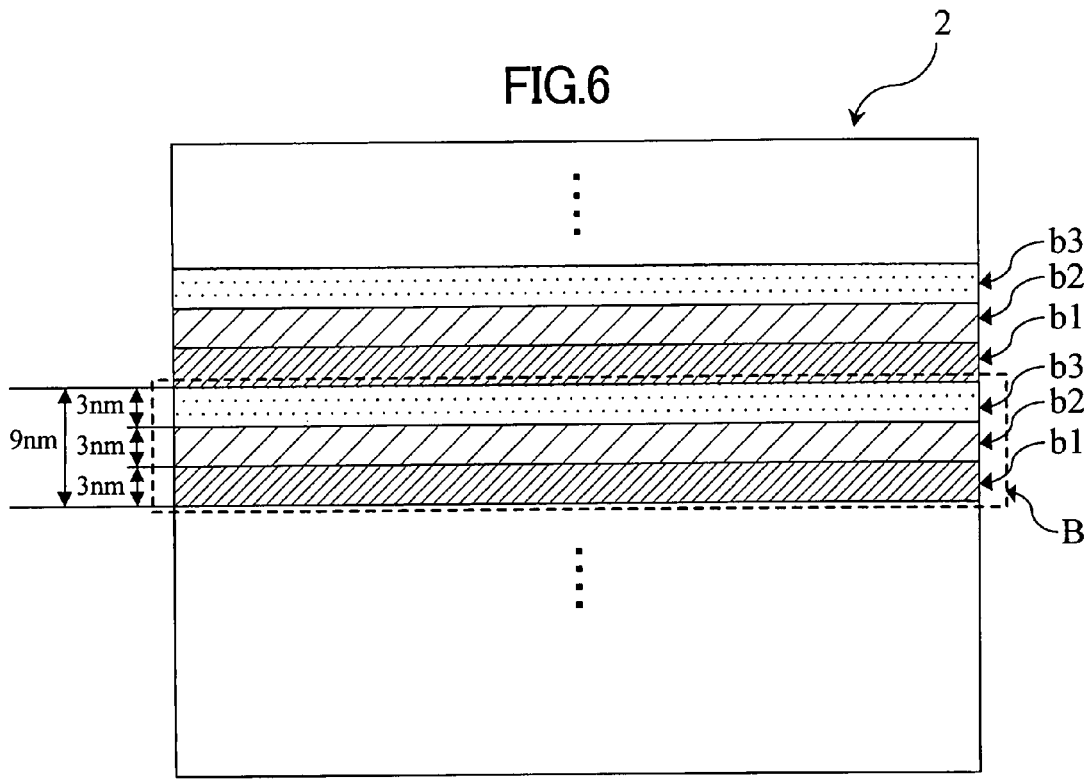
FIG. 6 shows an example of the composition of the variable-resistance film shown in FIG. 1.

As shown in FIG. 1, the lower electrode 3 was formed on the substrate 4. Then, sputtering was performed using a target of Fe—O to form the variable-resistance film 2 on the lower electrode 3. Then, the upper electrode 1 was formed on the variable-resistance film 2. In the formation of the variable-resistance film 2, the oxygen partial pressure in Ar gas was periodically changed in the order of "0%", "2%" and "4%" such that the cycle of composition modulation was "9 nm". Specifically, referring to FIG. 6, in the first period, sputtering was performed with the oxygen partial pressure of "0%" to form a reference layer b1 of 3 nm; in the second period, sputtering was performed with the oxygen partial pressure of "4%" to form a reference layer b2 of 3 nm; and in the third period, sputtering was performed with the oxygen partial pressure of "4%" to form a reference layer b3 of 3 nm. In such a way, the condition of oxygen partial pressure was periodically changed to form the variable-resistance film 2 including a plurality of periodic unit layers B deposited in succession along the film thickness direction. Herein, the periodic unit layer B consists of one reference layer b1, one reference layer b2 and one reference layer b3 as indicated by broken-line box in FIG. 6. Thus, electric element (A') was fabricated.

Upper electrode 1: Pt (thickness: 0.4 μm)
Variable-resistance film 2: Fe—O (thickness: 0.09 μm, thickness of periodic unit layer: 9 nm, three reference layers)
Lower electrode 3: Pt (thickness: 0.4 μm)

Then, the same experiment as that performed on electric element (A) was carried out on the thus-fabricated electric element (A'). The results of the experiment on electric element (A') were substantially the same as those of electric element (A) (see FIG. 3 and FIG. 4).

<Variation 1>

Figure 7:
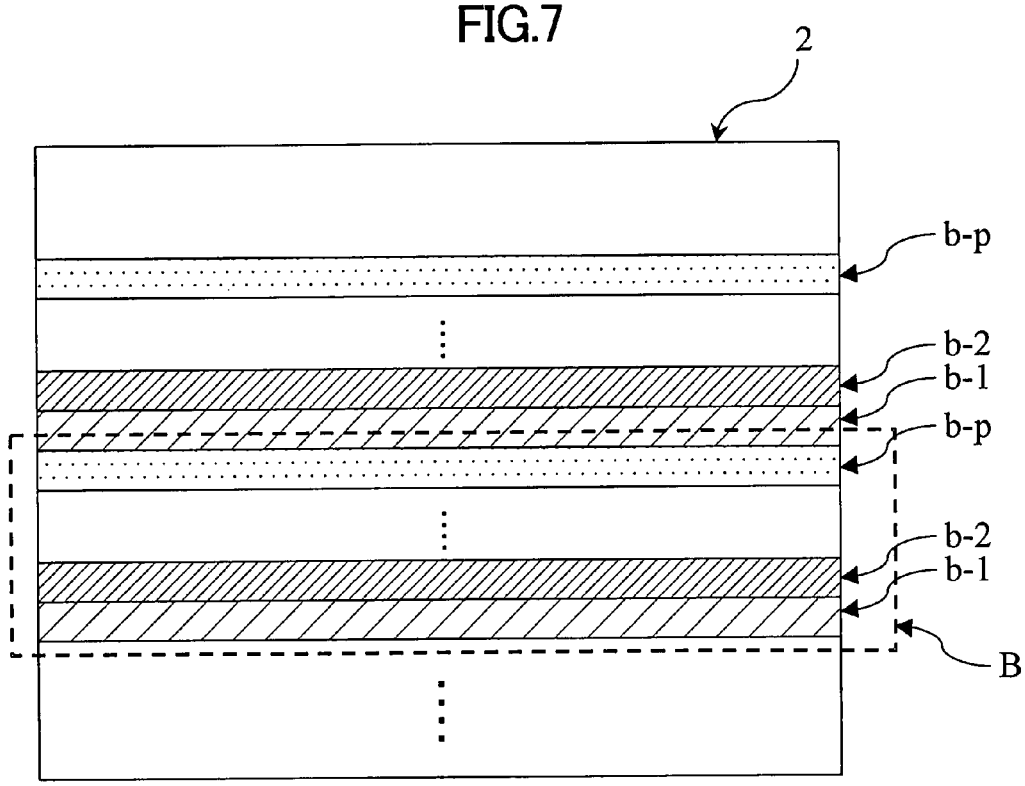
FIG. 7 shows an example of the composition of the variable-resistance film shown in FIG. 1.

Although electric element (A') was fabricated with the oxygen partial pressure repetitively changing in the order of "0%→2%→4%", "0%→2%→4%", . . . in order to deposit a plurality of periodic unit layers having the same structure in succession, an electric element fabricated with the oxygen partial pressure repetitively changing in the order of "0%→2%→4%→2%", "0%→2%→4%→2%", . . . also achieved substantially the same experimental results as those of electric element (A'). Namely, even an electric element which had p reference layers b-1, b-2, . . . , and b-p (p is a natural number equal to or greater than 3) in one periodic unit layer B as shown in FIG. 7 achieved the same effects.

<Variation 2>

Also, an electric element including the variable-resistance film 2 formed with the oxygen partial pressure repetitively changing in the order of "0%→2%→4%→0%→4%", "0%→2%→4%→0%→4%", . . . achieved substantially the same experimental results as those of electric element (A'). Namely, even an electric element which had a plurality of reference layers of the same oxygen content in one periodic unit layer achieved the same effects. For example, as for an electric element which had 5 reference layers in one periodic unit layer, the same effects were achieved both in a case where the 5 reference layers had respectively different oxygen contents, e.g., "0%", "1%", "2%", "3%", "4%", and in a case where two or more of the 5 reference layers had the same oxygen content, e.g., "0%", "2%", "4%", "0%", "2%".

<Electric Element (A")>

Next, the characteristics of electric element (A") are described. Electric element (A") includes a plurality of periodic unit layers deposited in succession along the film thickness direction to constitute the variable-resistance film 2. Each of the periodic unit layers has the oxygen content gradually changing along the film thickness direction.

Figure 8:
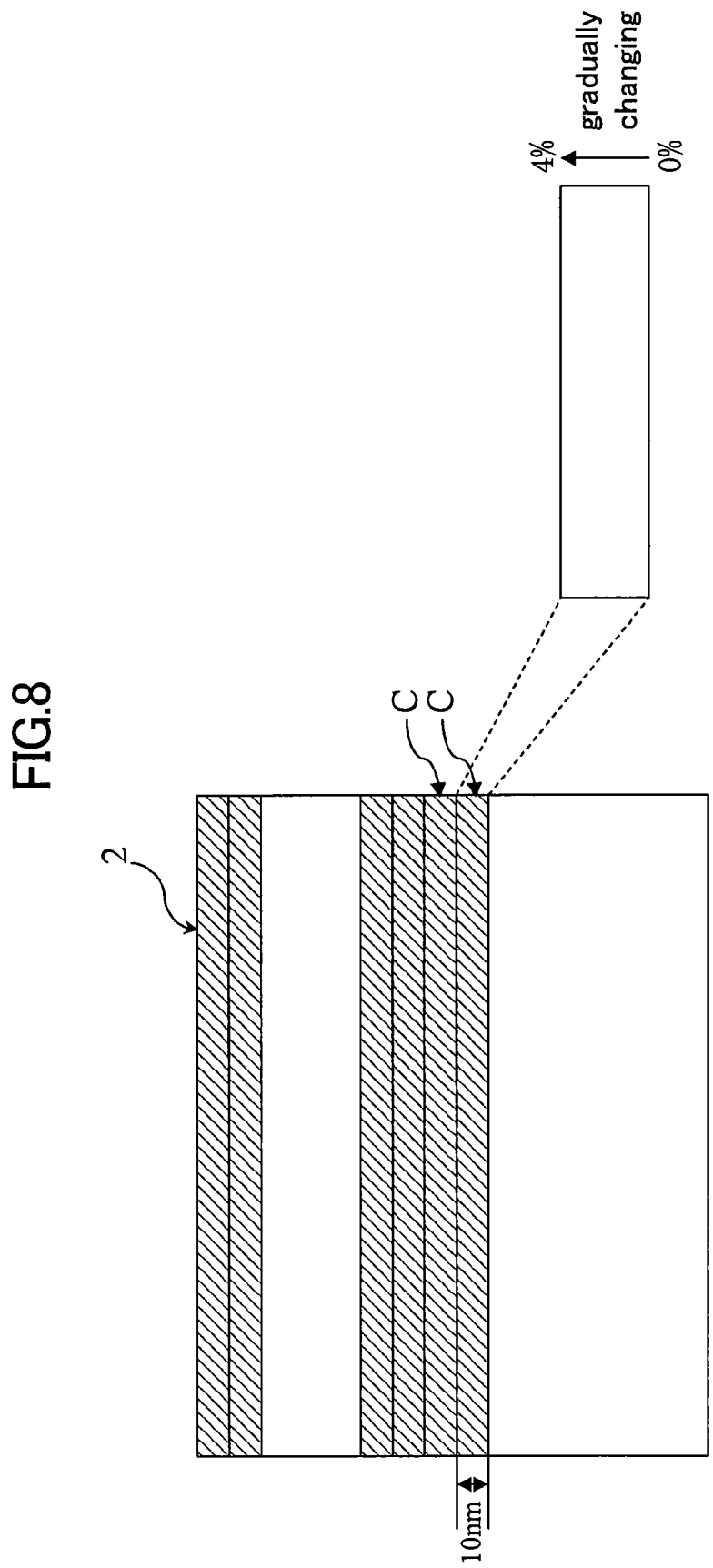
FIG. 8 shows an example of the composition of the variable-resistance film shown in FIG. 1.

As shown in FIG. 1, the lower electrode 3 was formed on the substrate 4. Then, sputtering was performed using a target of Fe—O to form the variable-resistance film 2 on the lower electrode 3. Then, the upper electrode 1 was formed on the variable-resistance film 2. In the formation of the variable-resistance film 2, the oxygen partial pressure in Ar gas was gradually changed from "0%" to "4%" such that the cycle of composition modulation was "10 nm". Specifically, referring to FIG. 8, sputtering was performed while the oxygen partial pressure was gradually increased from "0%" to "4%" within a predetermined period to form a periodic unit layer C having the thickness of 10 nm. This cycle was repeated to form the variable-resistance film 2 including a plurality of periodic unit layers deposited in succession along the film thickness direction. Thus, electric element (A") was fabricated.

Upper electrode 1: Pt (thickness: 0.4 μm)
Variable-resistance film 2: Fe—O (thickness: 0.1 μm, thickness of periodic unit layer: 10 nm, gradually changed)
Lower electrode 3: Pt (thickness: 0.4 μm)

Then, the same experiment as that performed on electric element (A) was carried out on the thus-fabricated electric element (A"). The results of the experiment on electric element (A") were substantially the same as those of electric element (A) (see FIG. 3 and FIG. 4).

It was found from the experimental results of electric element (A), electric element (A') and electric element (A") that fluctuations in variable-resistance characteristic of the electric element were suppressed by modulating the oxygen content of the variable-resistance film of the electric element along the film thickness direction. Thus, the reproducibility and production yield of the electric elements are improved as compared with the conventional techniques.

It should be noted that the ratio of oxygen partial pressure and method for mixing oxygen are not limited to the above-described conditions.

<Thickness of Periodic Unit Layer>

A plurality of electric elements (A) including periodic unit layers of different thicknesses were fabricated, and the resistance value was measured for each electric element (A). Herein, electric element (A) including 10 nm thick periodic unit layers, electric element (A) including 35 nm thick periodic unit layers, electric element (A) including 50 nm thick periodic unit layers, electric element (A) including 100 nm thick periodic unit layers, and electric element (A) including 150 nm thick periodic unit layers were fabricated. The resistance value of each electric element (A) was measured to make a distribution of measured resistance values as shown in FIG. 4, in which the half width of the peak value of the high resistance state and the half width of the peak value of the low resistance state were obtained.

Figure 9:
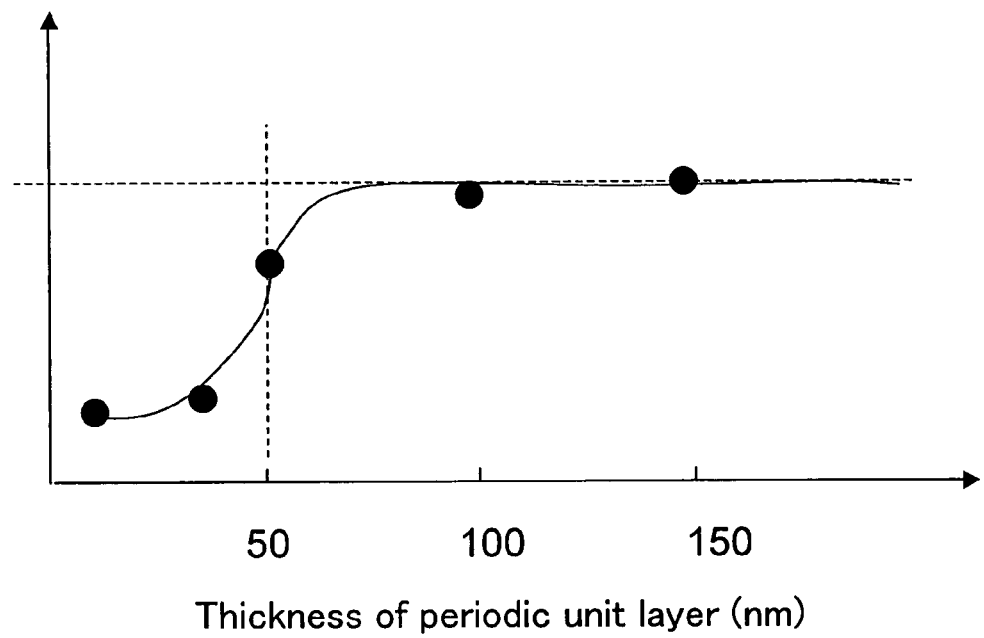
FIG. 9 is a graph illustrating the relationship between the half width of a resistance distribution and the thickness of a periodic unit layer.

FIG. 9 is a graph for comparing the half widths of the peak values of the high resistance state. As seen from FIG. 9, when the thickness of the periodic unit layer is "50 nm" or less, variations from the average value are suppressed. As for electric element (A') and electric element (A"), we also reached substantially the same results as those of electric element (A). The results for the half width of the peak value of the low resistance state were substantially the same as those for the high resistance state.

<Evaluation of Crystallinity>

The crystallinity of the variable-resistance film used in these electric elements was evaluated by electron diffraction using a transmission electron microscope. In the electron diffraction chart, we did not find an indication of an amorphous structure (halo pattern) but a pattern of dots derived from the crystalline structure. Further, the variable-resistance film was subjected to a cross-sectional TEM observation with a transmission electron microscope, through which we found crystals.

Embodiment 1

<Definition of Graphical Symbol>

Figure 10:
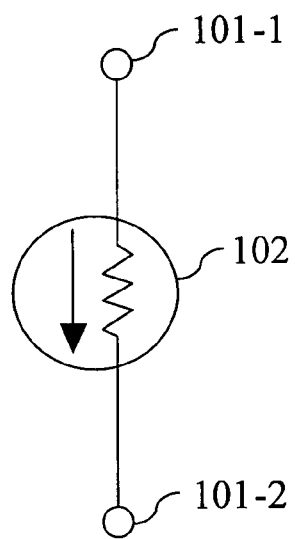
FIG. 10 shows a graphical symbol of an electric element of the present invention.

An electric element of embodiment 1 of the present invention is described. We define the graphical symbol of the electric element of embodiment 1 as shown in FIG. 10. In FIG. 10, the upper electrode 1 of FIG. 1 is connected to a terminal 101-1, while the lower electrode 3 of FIG. 1 is connected to a terminal 101-2.

Figure 11:
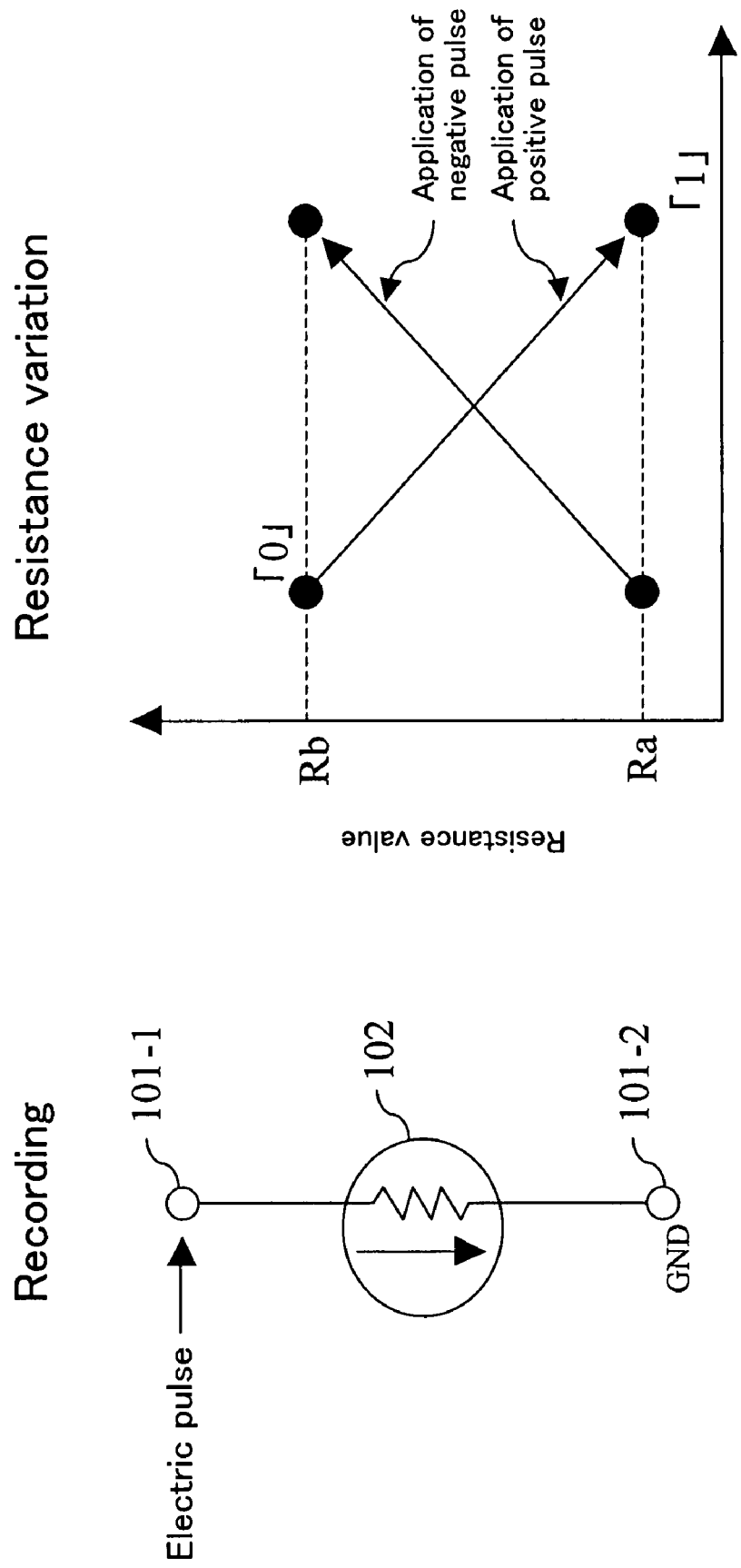
FIG. 11 illustrates the variation in resistance of the electric element shown in FIG. 10.

Referring to FIG. 11, when an electric pulse (positive pulse) which is to make the terminal 101-1 positive with respect to the terminal 101-2 is applied to an electric element 102, the resistance value of the electric element 102 decreases. On the contrary, when an electric pulse (negative pulse) which is to make the terminal 101-1 negative with respect to the terminal 101-2 is applied to the electric element 102, the resistance value of the electric element 102 increases. Namely, when an electric pulse is applied such that a current flows in the direction of the arrow, the resistance value of the electric element 102 decreases. On the contrary, when an electric pulse is applied such that a current flows in the direction opposite to the arrow, the resistance value of the electric element 102 increases.

Referring to FIG. 12, when a voltage which does not affect the variation in resistance of the electric element (reproduction voltage) is applied, an output current flows according to the resistance value of the electric element 102. Namely, when the resistance value of the electric element 102 is "Ra", an output current which has current value "Ia" flows. When the resistance value of the electric element 102 is "Rb", an output current which has current value "Ib" flows.

<Operation>

Next, the operation of the electric element 102 shown in FIG. 10 is described. Herein, the electric element 102 is used as a memory to perform a process of 1-bit data. It is assumed that the resistance value of the electric element 102 is initialized to a high resistance state. It is further assumed that when the resistance value of the electric element 102 is at "high resistance state", the logical value is "0", and that when the resistance value of the electric element 102 is at "low resistance state", the logical value is "1".

[Memorization]

To write 1-bit data representing "1" in the electric element 102, the terminal 101-2 is pulled down to the ground, and a memorization voltage is applied to the terminal 101-1. The memorization voltage is, for example, an electric pulse which has a voltage value of +2.5 V and a pulse width of 100 nsec. Since the positive pulse is applied to the electric element 102, the resistance value of the electric element 102 results in the low resistance state. In this way, 1-bit data representing "1" is stored in the electric element 102.

[Reset]

To reset the memory state of the electric element 102 to the initial state, the terminal 101-2 is pulled down to the ground, and a reset voltage is applied to the terminal 101-1. The reset voltage is, for example, an electric pulse which has a voltage value of −2.5 V and a pulse width of 100 nsec. Since the negative pulse is applied to the electric element 102, the resistance value of the electric element 102 returns to the high resistance state. In this way, the memory state of the electric element 102 is returned to the initial state.

[Reproduction]

To read data from the electric element 102, the terminal 101-2 is pulled down to the ground, and a reproduction voltage is applied to the terminal 101-1. The reproduction voltage is, for example, a voltage which has a voltage value of +0.5 V. Since the reproduction voltage is applied to the electric element 102, an electric current which has an electric value determined according to the resistance value of the electric element 102 flows between the terminal 101-1 and the terminal 101-2. Then, the resistance value of the electric element 102 is calculated based on the current value of the current flowing between the terminal 101-1 and the terminal 101-2 and the voltage value of the reproduction voltage. Assuming herein that the resistance value of the electric element 102 indicative of "high resistance state" corresponds to "0" and the resistance value of the electric element 102 indicative of "low resistance state" corresponds to "1", the above current flow means reproduction of 1-bit data from the electric element 102.

<Effects>

As described above, the electric element 102 can be used as a memory. The material of the variable-resistance film of the memory is not amorphous but has a microcrystalline structure. Therefore, the reliability of the electric element as the memory can be maintained even after hours of use as compared with conventional memory devices.

The voltages applied to the terminal 101-1 and the terminal 101-2 are not limited to the values shown above. The same effects are achieved by applying, for memorization, voltages to the terminal 101-1 and the terminal 101-2 such that a positive pulse is applied to the electric element. Likewise, the same effects are also achieved by applying, for reset, voltages to the terminal 101-1 and the terminal 101-2 such that a negative pulse is applied to the electric element. This basically applies to reproduction.

In this embodiment, values are allocated to two states of resistance for reading and writing "1-bit" data. Alternatively, values may be uniquely allocated to three or more states of resistance for reading and writing "multi-bit" data. In this case, the voltage value of a pulse voltage to be applied or the number of applications of the pulse voltage may be adjusted according to the value of the multi-bit data.

Embodiment 2

<General Structure>

Figure 13:
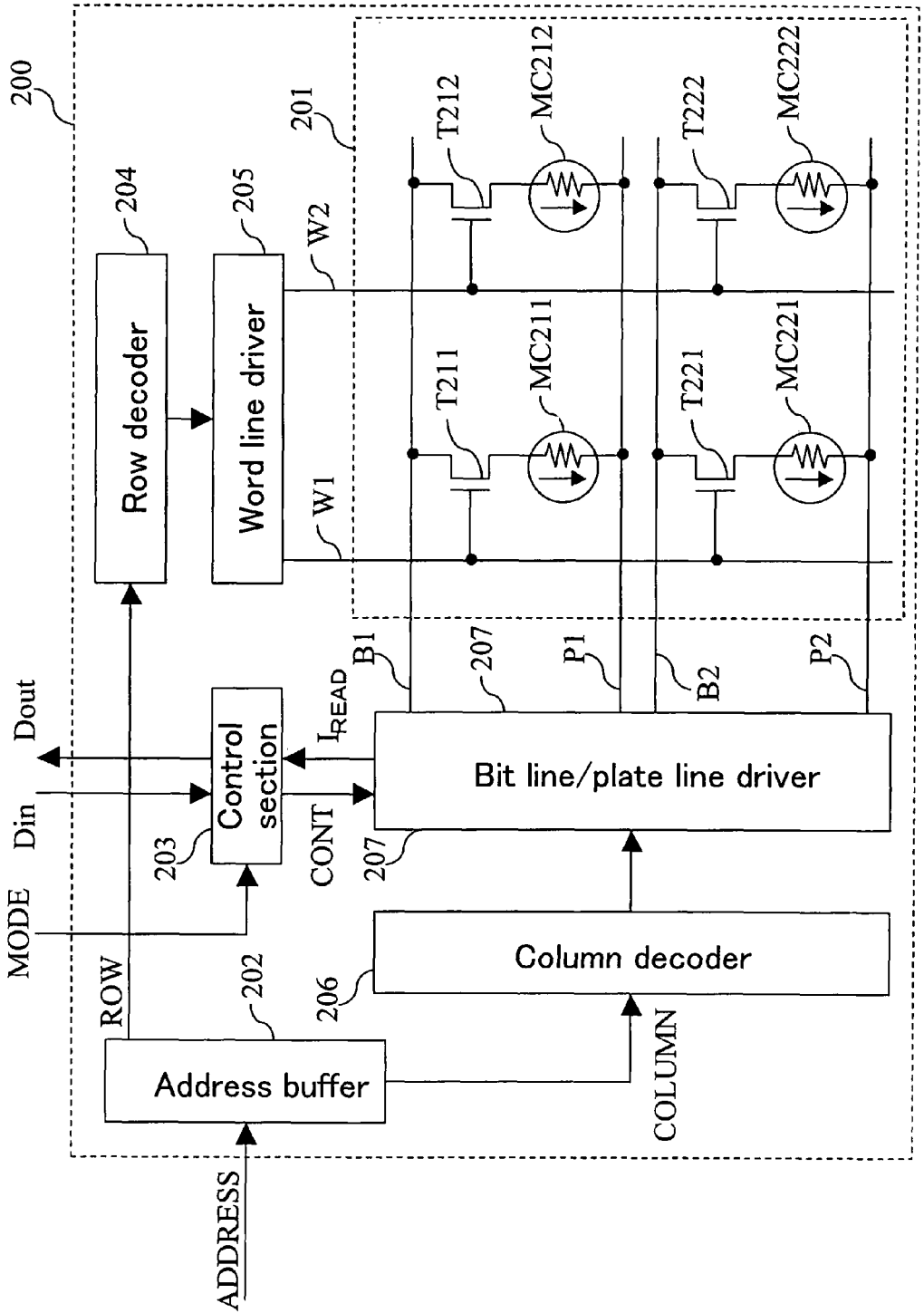
FIG. 13 shows a general structure of a memory device according to embodiment 2 of the present invention.

The general structure of a memory device 200 according to embodiment 2 of the present invention is shown in FIG. 13. The memory device 200 includes a memory array 201, an address buffer 202, a control section 203, a row decoder 204, a word line driver 205, a column decoder 206, and a bit line/plate line driver 207.

The memory array 201 includes word lines W1 and W2, bit lines B1 and B2, plate lines P1 and P2, transistors T211, T212, T221 and T222, and memory cells MC211, MC212, MC221 and MC222. Each of the memory cells MC211, MC212, MC221 and MC222 is the electric element 102 shown in FIG. 10.

The respective connections of the transistors T211 through T222 and the memory cells MC211 through MC222 are equal, and hence, the connection of the transistor T211 and the memory cell MC211 is described as a representative pair. The transistor T211 and the memory cell MC211 are connected in series between the bit line B1 and the plate line P1. The transistor T211 is connected between the bit line B1 and the memory cell MC211, and the gate of the transistor T211 is connected to the word line W1. The memory cell MC211 is connected between the transistor T211 and the plate line P1. Each of the transistors T211 through T222 is rendered conductive when a predetermined voltage (activation voltage) is applied to a word line corresponding to the transistor.

The address buffer 202 receives address signal ADDRESS supplied from the outside of the memory device 200 to output row address signal ROW to the row decoder 204 and output column address signal COLUMN to the column decoder 206. Address signal ADDRESS indicates an address of a memory cell selected from the memory cells MC211, MC212, MC221 and MC222. Row address signal ROW indicates the row address of the address indicated by address signal ADDRESS. Column address signal COLUMN indicates the column address of the address indicated by address signal ADDRESS.

The control section 203 enters any one of memorization mode, reset mode, and reproduction mode according to mode selection signal MODE supplied from the outside of the memory device 200. In the memorization mode, the control section 203 outputs a control signal CONT which indicates "application of memorization voltage" to the bit line/plate line driver 207 according to input data Din supplied from the outside of the memory device 200. In the reproduction mode, the control section 203 outputs a control signal CONT which indicates "application of reproduction voltage" to the bit line/plate line driver 207. In the reproduction mode, the control section 203 outputs to an external device output data Dout indicative of a bit value which is determined according to signal $I_{READ}$ received from the bit line/plate line driver 207.

Signal $I_{READ}$ indicates the current value of an electric current flowing through the plate lines P1 and P2 in the reproduction mode. In the reset mode, the control section 203 checks the memory state of the memory cells MC211 through MC222 and outputs a control signal CONT which indicates "application of reset voltage" to the bit line/plate line driver 207 according to the checked memory state.

The row decoder 204 selects any one of the word lines W1 and W2 according to row address signal ROW received from the address buffer 202.

The word line driver 205 applies the activation voltage to a word line selected by the row decoder 204.

The column decoder 206 selects any one of the bit lines B1 and B2 and any one of the plate lines P1 and P2 according to column address signal COLUMN received from the address buffer 202.

When receiving the control signal CONT which indicates "application of memorization voltage" from the control section 203, the bit line/plate line driver 207 applies memorization voltage $V_{WRITE}$ to the bit line selected by the column decoder 206 and pulls the plate line selected by the column decoder 206 to the ground. When receiving the control signal CONT which indicates "application of reproduction voltage" from the control section 203, the bit line/plate line driver 207 applies reproduction voltage $V_{READ}$ to the bit line selected by the column decoder 206 and pulls the plate line selected by the column decoder 206 to the ground. Thereafter, the bit line/plate line driver 207 outputs to the control section 203 signal $I_{READ}$ which indicates the current value of an electric current flowing through the plate line. When receiving the control signal CONT which indicates "application of reset voltage" from the control section 203, the bit line/plate line driver 207 applies reset voltage $V_{RESET}$ to the bit line selected by the column decoder 206 and pulls the plate line selected by the column decoder 206 to the ground.

Memorization voltage $V_{WRITE}$ is an electric pulse which has, for example, a voltage value of +2.5 V and a pulse width of 100 nsec. Reproduction voltage $V_{READ}$ is a voltage which has, for example, a voltage value of +0.5 V. Reset voltage $V_{RESET}$ is an electric pulse which has, for example, a voltage value of −2.5 V and a pulse width of 100 nsec.

<Operation>

Next, an operation of the memory device 200 shown in FIG. 13 is described. The operation modes of the memory device 200 include the memorization mode where input data Din is written in a memory cell, the reset mode where information written in a memory cell is reset, and the reproduction mode where information written in a memory cell is output (reproduced) as output data Dout. It is assumed herein that the memory cells MC211 through MC222 are initialized to the high resistance state. It is further assumed that address signal ADDRESS indicates the address of the memory cell MC211.

[Memorization Mode]

In the first place, the operation in the memorization mode is described.

When input data Din represents "1", the control section 203 outputs a control signal CONT which indicates "application of memorization voltage" to the bit line/plate line driver 207. When input data Din represents "0", the control section 203 does not output a control signal CONT.

Receiving the control signal CONT which indicates "application of memorization voltage" from the control section 203, the bit line/plate line driver 207 applies memorization voltage $V_{WRITE}$ to the bit line B1 selected by the column decoder 206 and pulls the plate line P1 selected by the column decoder 206 to the ground.

In the meantime, the word line driver 205 applies the activation voltage to the word line W1 selected by the row decoder 204.

Since the above conditions mean that an electric pulse (positive pulse) which has a voltage value of +2.5 V and a pulse width of 100 nsec is applied to the memory cell MC211, the resistance value of the memory cell MC211 results in the low resistance state.

Since the positive pulse is not applied to the memory cell MC212, MC221 or MC222, the resistance states of the memory cells MC212, MC221 and MC222 do not change.

Thus, since only the resistance state of the memory cell MC211 changes to the "low resistance state", 1-bit data representing "1" is written in the memory cell MC211.

After the writing of data in the memory cell MC211 has been completed, new address signal ADDRESS is input to the address buffer 202, and the above-described operation in the memorization mode is repeated.

[Reproduction Mode]

Next, the operation in the reproduction mode is described.

The control section 203 outputs a control signal CONT which indicates "application of reproduction voltage" to the bit line/plate line driver 207.

Receiving the control signal CONT which indicates "application of reproduction voltage" from the control section 203, the bit line/plate line driver 207 applies reproduction voltage $V_{READ}$ to the bit line B1 selected by the column decoder 206 and pulls the plate line P1 selected by the column decoder 206 to the ground.

In the meantime, the word line driver 205 applies the activation voltage to the word line W1 selected by the row decoder 204.

Since the above conditions mean that a voltage (measurement voltage) which has a voltage value of 0.5 V is applied to the memory cell MC211, an electric current having a current value determined according to the resistance value of the memory cell MC211 flows through the memory cell MC211 and then flows out to the bit line B1.

Since the measurement voltage is not applied to the memory cell MC212, MC221 or MC222, no current flows through the memory cells MC212, MC221 or MC222.

Then, the bit line/plate line driver 207 measures the current value of an electric current flowing through the plate line P1 and outputs to the control section 203 signal $I_{READ}$ which indicates the measured current value. The control section 203 then outputs to an external device output data Dout which is determined according to the current value indicated by signal $I_{READ}$. For example, if the measured current value is a current value of an electric current which flows in the case of the low resistance state, output data Dout which is output from the control section 203 represents "1".

Thus, since an electric current flows only through the memory cell MC211 and the electric current flows out to the plate line P1, 1-bit data is read from the memory cell MC211.

After the reading of data from the memory cell MC211 has been completed, new address signal ADDRESS is input to the address buffer 202, and the above-described operation in the reproduction mode is repeated.

[Reset Mode]

Next, the operation in the reset mode is described.

The control section 203 checks the memory state of the memory cell MC211 through the process of the reproduction mode.

In the case where the control section 203 determines that the memory cell MC211 stores bit data representing "1" (the memory cell MC211 is at the low resistance state), the control section 203 outputs a control signal CONT which indicates "application of reset voltage" to the bit line/plate line driver 207. In the case where the memory cell MC211 stores bit data representing "0" (the memory cell MC211 is at the high resistance state), the control section 203 does not output a control signal CONT.

Receiving the control signal CONT which indicates "application of reset voltage" from the control section 203, the bit line/plate line driver 207 applies reset voltage $V_{RESET}$ to the bit line B1 selected by the column decoder 206 and pulls the plate line P1 selected by the column decoder 206 to the ground.

In the meantime, the word line driver 205 applies the activation voltage to the word line W1 selected by the row decoder 204.

Since the above conditions mean that an electric pulse (negative pulse) which has a voltage value of −2.5 V and a pulse width of 100 nsec is applied to the memory cell MC211, the resistance value of the memory cell MC211 results in the high resistance state.

Since the negative pulse is not applied to the memory cell MC212, MC221 or MC222, the resistance states of the memory cells MC212, MC221 and MC222 do not change.

Thus, since only the resistance state of the memory cell MC211 changes to the "high resistance state", 1-bit data stored in the memory cell MC211 is reset.

After the resetting of the memory cell MC211 has been completed, new address signal ADDRESS is input to the address buffer 202, and the above-described operation in the reset mode is repeated.

<Effects>

As described above, the electric element 102 can be used as a memory array. The material of the variable-resistance film of the memory is not amorphous but has a microcrystalline structure. Therefore, the reliability of the electric element as the memory array can be maintained even after hours of use as compared with conventional memory devices.

Also, a memory array which occupies a large part of a memory device can be fabricated with high accuracy. Therefore, the memory device can be fabricated with a considerably high production yield as compared with conventional memory devices.

FIG. 13 shows only four memory cells but the present invention is not limited thereto. For example, 5 or more memory cells may be arranged in a matrix.

Embodiment 3

<Structure>

The structure of a semiconductor integrated circuit (Embedded-RAM) 300 according to embodiment 3 of the present invention is shown in FIG. 12. The circuit 300 includes the memory device 200 shown in FIG. 13 and a logic circuit 301 and is formed as a single semiconductor chip. The memory device 200 is used as a data RAM. The logic circuit 301 is a circuit which performs a predetermined operation (e.g., encoding or decoding of sound data or image data) and uses the memory device 200 in the operation. The logic circuit 301 controls address signal ADDRESS and mode selection signal MODE which are supplied to the memory device 200 to write data in or read data from the memory device 200.

<Operation>

Figure 14:
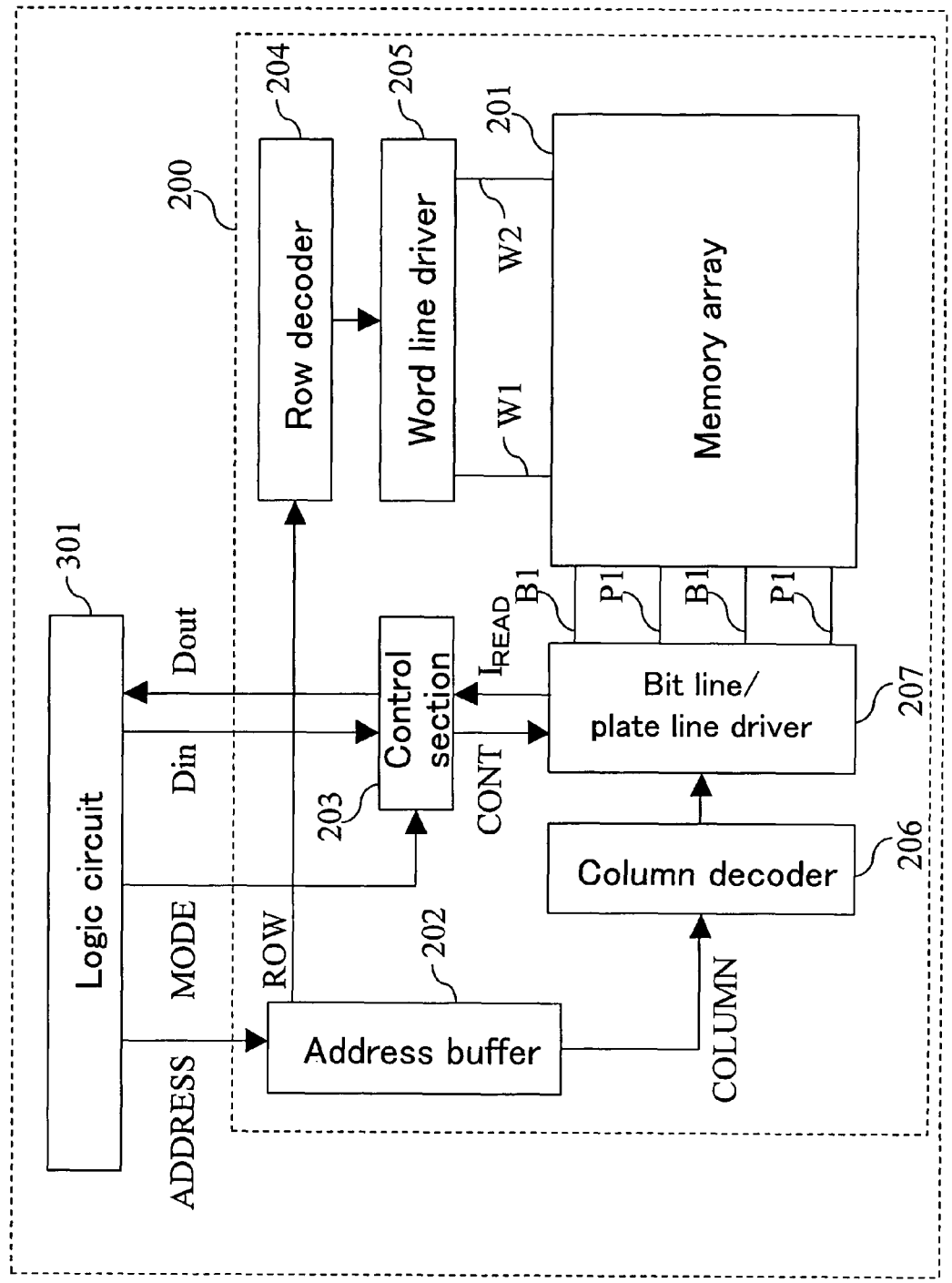
FIG. 14 shows a general structure of a semiconductor integrated circuit according to embodiment 3 of the present invention.

Next, the operation of the semiconductor integrated circuit (Embedded-RAM) 300 shown in FIG. 14 is described. The operation of the circuit 300 includes a write process for writing predetermined data (bit data) in the memory device 200, a read process for reading data written in the memory device 200, and a reset process for resetting data written in the memory device 200.

[Write Process]

In the first place, the write process is described.

To write predetermined data (for example, encoded moving picture data, or the like) in the memory device 200, the logic circuit 301 outputs a mode selection signal MODE which indicates "memorization mode" to the control section 203 of the memory device 200.

Then, to select memory cells in which the predetermined data is to be written, the logic circuit 301 sequentially outputs address signals ADDRESS to the address buffer 202 of the memory device 200. As a result, in the memory device 200, memory cells are sequentially selected according to address signals ADDRESS.

Then, the logic circuit 301 outputs the predetermined data on a bit-by-bit basis as 1-bit data Din to the control section 203 of the memory device 200.

Then, in the memory device 200, the same operation as that of the memorization mode of embodiment 2 is performed. As a result, the predetermined data is written in the memory device 200 on a bit-by-bit basis.

[Read Process]

Next, the read process is described.

To read data written in the memory device 200, the logic circuit 301 outputs a mode selection signal MODE which indicates "reproduction mode" to the control section 203 of the memory device 200.

Then, to select memory cells from which written data is to be read, the logic circuit 301 sequentially outputs address signals ADDRESS to the address buffer 202 of the memory device 200. As a result, in the memory device 200, memory cells are sequentially selected according to address signals ADDRESS.

Then, in the memory device 200, the same operation as that of the reproduction mode of embodiment 2 is performed. As a result, the data stored in the memory device 200 is read on a bit-by-bit basis as output data Dout.

[Reset Process]

Next, the reset process is described.

To reset data written in the memory device 200, the logic circuit 301 outputs a mode selection signal MODE which indicates "reset mode" to the control section 203 of the memory device 200.

Then, to select memory cells in which stored data is to be reset, the logic circuit 301 sequentially outputs address signals ADDRESS to the address buffer 202 of the memory device 200. As a result, in the memory device 200, memory cells are sequentially selected according to address signals ADDRESS.

Then, in the memory device 200, the same operation as that of the reset mode of embodiment 2 is performed. As a result, the data stored in the memory device 200 is reset on a bit-by-bit basis.

<Effects>

As described above, a large amount of information can be stored quickly in the memory device 200.

Embodiment 4

<Structure>

Figure 15:
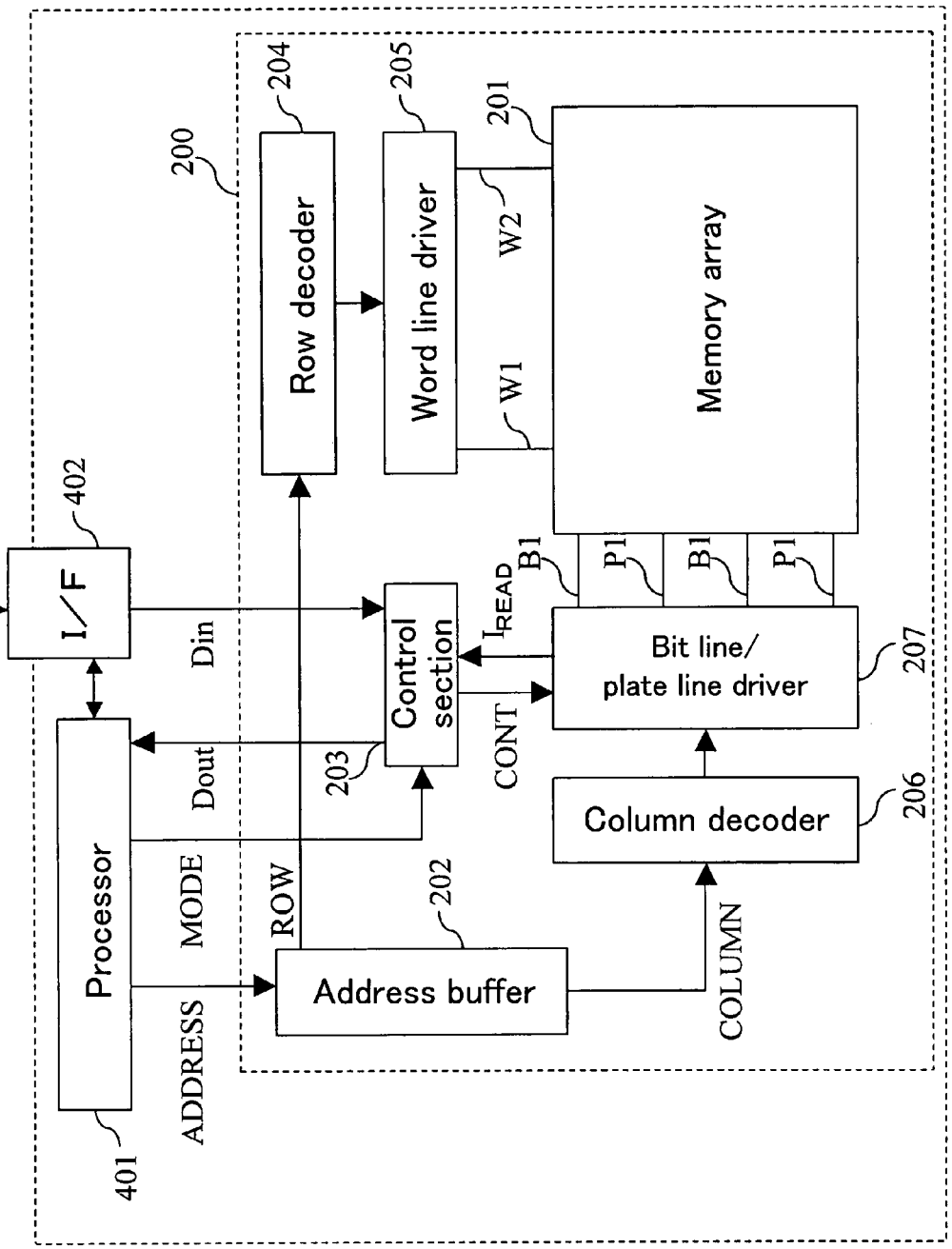
FIG. 15 shows a general structure of a semiconductor integrated circuit according to embodiment 4 of the present invention.

The structure of a semiconductor integrated circuit (reconfigurable LSI) 400 according to embodiment 4 of the present invention is shown in FIG. 15. The circuit 400 includes the memory device 200 shown in FIG. 13, a processor 401 and an interface 402 and is formed as a single semiconductor chip.

The memory device 200 is used as a program ROM to store a program necessary for the operation of the processor 401. The processor 401 operates according to the program stored in the memory device 200 to control the memory device 200 and the interface 402. The interface 402 sequentially outputs to the memory device 200 a program supplied from an external device.

<Operation>

Next, the operation of the semiconductor integrated circuit (reconfigurable LSI) 400 shown in FIG. 15 is described. The operation of the circuit 400 includes a program execution process wherein the circuit 400 operates according to a stored program and a program rewrite process for rewriting the program stored in the memory device 200 to another new program.

[Program Execution Process]

In the first place, the program execution process is described.

To read a program stored in the memory device 200, the processor 401 outputs a mode selection signal MODE which indicates "reproduction mode" to the control section 203 of the memory device 200.

Then, the processor 401 sequentially outputs to the address buffer 202 of the memory device 200 address signals ADDRESS indicative of memory cells in which the required program is stored. As a result, in the memory device 200, memory cells are sequentially selected according to address signals ADDRESS.

Then, in the memory device 200, the same operation as that of the reproduction mode of embodiment 2 is performed. As a result, the program stored in the memory device 200 is read on a bit-by-bit basis as output data Dout.

Then, the processor 401 performs a predetermined operation according to the program read from the memory device 200.

[Program Rewrite Process]

Next, the program rewrite process is described.

To erase a program stored in the memory device 200 (a program which is to be rewritten), the processor 401 outputs a mode selection signal MODE which indicates "reset mode" to the control section 203 of the memory device 200.

Then, the processor 401 sequentially outputs to the address buffer 202 of the memory device 200 address signals ADDRESS indicative of memory cells storing the program to be rewritten. As a result, in the memory device 200, memory cells are sequentially selected according to address signals ADDRESS.

Then, in the memory device 200, the same operation as that of the reset mode of embodiment 2 is performed. As a result, the program stored in the memory cells is reset on a bit-by-bit basis.

After the completion of the resetting of the memory cells, the processor 401 outputs a mode selection signal MODE which indicates "memorization mode" to the control section 203 of the memory device 200 in order to write a new program.

Then, the processor 401 sequentially outputs to the address buffer 202 of the memory device 200 address signals ADDRESS which indicate the positions of memory cells in which a new program is to be stored. As a result, in the memory device 200, memory cells are sequentially selected according to address signals ADDRESS.

Then, the processor 401 outputs a new program supplied from an external device through the interface 402 to the control section 203 of the memory device 200 on a bit-by-bit basis. In the memory device 200, the same operation as that of the memorization mode of embodiment 2 is performed. As a result, the new program is stored in the memory device 200 on a bit-by-bit basis.

Thus, since the memory device 200 is a rewritable nonvolatile memory, it is possible to rewrite a program stored in the memory device 200. That is, the function realized in the processor 401 can be changed. Further, it is possible that a plurality of programs are stored in the memory device 200, and the function realized in the processor 401 can be changed according to a program read out from the memory device 200.

<Effects>

As described above, different functions can be realized with a single LSI, i.e., a reconfigurable LSI is realized.

In the above descriptions, the resistance state of the electric element can be changed when an applied electric pulse satisfies predetermined conditions. Thus, in the memorization and reset operations, an electric pulse which satisfies corresponding conditions is applied to the electric element, and in the reproduction operation, a voltage which does not satisfy the conditions is applied to the electric element, whereby the same effects can be achieved. That is, although in the above-described example the resistance state of the electric element changes from "high resistance state" to "low resistance state" when a positive pulse having a voltage value of +2.5 V and a pulse width of 100 nsec is applied, the same effects can be achieved even when the applied pulse voltage has a different voltage value and a different pulse width.

Figure 16A:
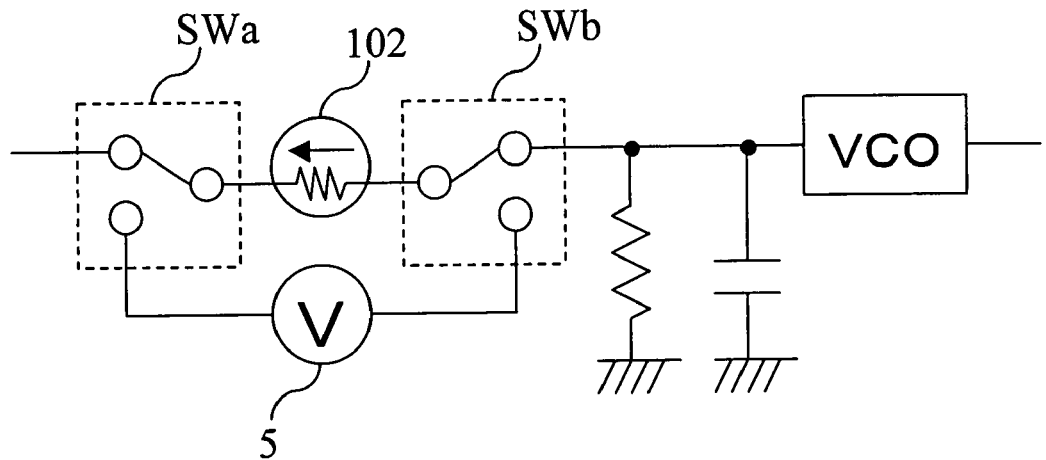
FIG. 16A shows an example of uses of an electric element.
Figure 16B:
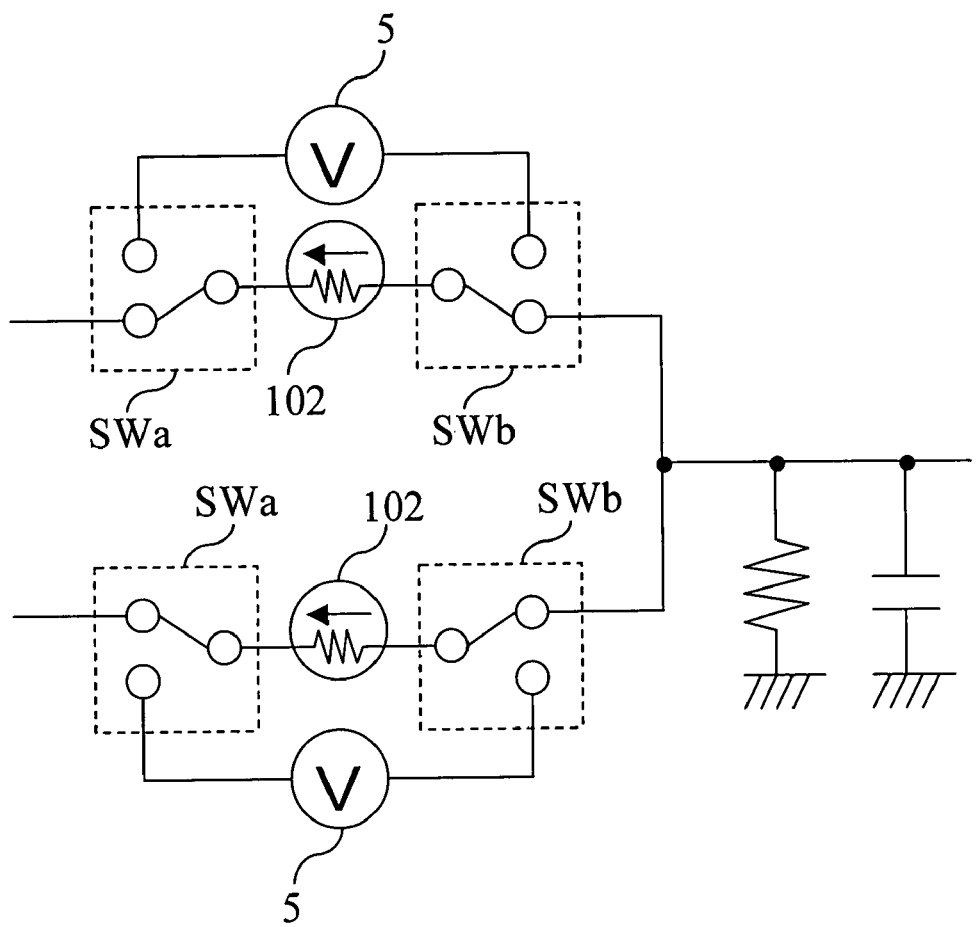
FIG. 16B shows another example of uses of an electric element.

Although in the above-described examples of the embodiments an electric element of the present invention is used as a "memory device", the present invention is not limited to this use. For example, an electric element of the present invention can be used as a switching element for switching a plurality of signals, a variable-resistance element used for switching the frequency (see FIG. 16A), a variable-resistance element for determining the mixture ratio of signals (see FIG. 16B), a time constant changer element used in combination with a capacitor to determine the time constant, etc. For example, in FIG. 16A and FIG. 16B, in order to change the resistance value of the electric element 102, switches SWa and SWb are switched to electrically connect the electric element 102 and power supply 5. Then, the power supply 5 applies a predetermined electric pulse to the electric element 102, whereby the resistance value of the electric element 102 is changed. Then, the switches SWa and SWb are restored to the default connection state. In this way, the electric element 102 is used as a variable-resistance element to realize a frequency-variable circuit (FIG. 16A) and a mixing circuit for changing the mixture ratio (FIG. 16B).

INDUSTRIAL APPLICABILITY

An electric element of the present invention can be fabricated with high production yield and is therefore useful for a nonvolatile memory, a variable-resistance element, etc.

The invention claimed is:

1. An electric element, comprising:
   a first electrode;
   a second electrode; and
   a variable-resistance film connected between the first electrode and the second electrode,
   wherein the variable-resistance film contains Fe (iron) and O (oxygen) as constituent elements, and the content of oxygen is modulated along a film thickness direction.

2. The electric element of claim 1, wherein:
   the variable-resistance film includes a plurality of reference layers deposited in succession along the film thickness direction; and the oxygen content in each of the plurality of reference layers is different from those of neighboring reference layers.

3. The electric element of claim 1, wherein:
the variable-resistance film includes a plurality of periodic unit layers deposited in succession along the film thickness direction;
each of the plurality of periodic unit layers includes a plurality of reference layers deposited in succession along the film thickness direction; and
the oxygen content in each of the plurality of reference layers is different from those of neighboring reference layers.

4. The electric element of claim 3, wherein the plurality of reference layers include a first reference layer having a first oxygen content and a second reference layer having a second oxygen content and deposited on the first reference layer.

5. The electric element of claim 3, wherein the oxygen content in each of the plurality of reference layers is different from those of the other reference layers included in the same periodic unit layer.

6. The electric element of claim 3, wherein the thickness of the periodic unit layer is 50 nm or less.

7. The electric element of claim 1, wherein:
the variable-resistance film includes a plurality of periodic unit layers deposited in succession along the film thickness direction; and
each of the plurality of periodic unit layers has an oxygen content gradually changing along the film thickness direction.

8. The electric element of claim 7, wherein the thickness of the periodic unit layer is 50 nm or less.

9. The electric element of claim 1, wherein the thickness of the variable-resistance film is 200 nm or less.

10. The electric element of claim 1, wherein at least one of the first electrode and the second electrode is formed using any of Ag, Au, Pt, Ru, $RuO_2$, Ir, and $IrO_2$.

11. The electric element of claim 1, wherein the electric element stores 1-bit or multi-bit information by applying a predetermined electric pulse between the first electrode and the second electrode such that the resistance value is changed.

12. The electric element of claim 1, wherein 1-bit or multi-bit information is read from the electric element by applying a predetermined voltage between the first electrode and the second electrode such that an electric current flows according to the resistance value of the electric element.

13. A memory device, comprising:
a plurality of word lines;
a plurality of bit lines;
a plurality of plate lines corresponding to the plurality of bit lines on a one-to-one basis;
a plurality of transistors;
a plurality of electric elements corresponding to the plurality of transistors on a one-to-one basis;
a word line driver for driving the plurality of word lines; and
a bit line/plate line driver for driving the plurality of bit lines and the plurality of plate lines,
wherein each of the plurality of transistors and an electric element corresponding to the transistor are connected in series between any one of the plurality of bit lines and a plate line corresponding to the bit line,
each of the plurality of transistors is connected between a bit line corresponding to the transistor and an electric element corresponding to the transistor, a gate of the transistor being connected to any one of the plurality of word lines,
each of the plurality of electric elements includes a first electrode connected to a transistor corresponding to the electric element, a second electrode connected to a plate line corresponding to the electric element, and a variable-resistance film connected between the first electrode and the second electrode, and
the variable-resistance film contains Fe (iron) and O (oxygen) as constituent elements, and the content of oxygen is modulated along the film thickness direction.

14. The memory device of claim 13, wherein in order to store information in any one of the plurality of electric elements,
the word line driver applies an activation voltage to one of the plurality of word lines connected to the electric element in which the information is to be stored; and
the bit line/plate line driver applies a first electric pulse to one of the plurality of bit lines connected to the electric element in which the information is to be stored and applies a second electric pulse to a plate line corresponding to the bit line.

15. The memory device of claim 13, wherein in order to reproduce information stored in any one of the plurality of electric elements,
the word line driver applies an activation voltage to one of the plurality of word lines connected to the electric element from which the information is to be read; and
the bit line/plate line driver applies a first reproduction voltage to one of the plurality of bit lines connected to the electric element from which the information is to be read and applies a second reproduction voltage to a plate line corresponding to the bit line.

16. A semiconductor integrated circuit, comprising:
the memory device of claim 13; and
a logic circuit which has a memorization mode and a reproduction mode,
wherein in the memorization mode, the logic circuit stores bit data in the memory device, and
in the reproduction mode, the logic circuit reads bit data stored in the memory device.

17. A semiconductor integrated circuit, comprising:
the memory device of claim 13; and
a processor which has a program execution mode and a program rewrite mode,
wherein in the program execution mode, the processor operates according to a program stored in the memory device, and
in the program rewrite mode, the processor rewrites a program stored in the memory device to another new program received from outside.

* * * * *